United States Patent [19]

Auda et al.

[11] Patent Number: 5,223,914
[45] Date of Patent: Jun. 29, 1993

[54] FOLLOW-UP SYSTEM FOR ETCH PROCESS MONITORING

[75] Inventors: Bernard Auda, Linas/Montlhery; Roland Chanclou, Perthes en Gatinais, both of France

[73] Assignee: International Business Machines Corporation, Armonk, N.Y.

[21] Appl. No.: 821,108

[22] Filed: Jan. 15, 1992

Related U.S. Application Data

[62] Division of Ser. No. 509,920, Apr. 16, 1990, Pat. No. 5,139,904.

[30] Foreign Application Priority Data

Apr. 28, 1989 [EP] European Pat. Off. ........ 89480070.5

[51] Int. Cl.$^5$ ............................................ G01B 11/02
[52] U.S. Cl. .................... 356/381; 356/316; 250/372
[58] Field of Search ............... 356/381, 311, 316, 357; 204/192.13, 192.33, 298.32; 156/626, 627; 250/372

[56] References Cited

U.S. PATENT DOCUMENTS

| | | | |
|---|---|---|---|
| 3,873,361 | 3/1975 | Franco et al. | 117/212 |
| 3,997,367 | 12/1976 | Yau | 148/1.5 |
| 4,003,044 | 1/1977 | Richmond, Jr. | 340/253 |
| 4,198,261 | 4/1980 | Busta et al. | 156/626 |
| 4,328,068 | 5/1982 | Curtis | 204/298.32 |
| 4,415,402 | 11/1983 | Gelernt et al. | 156/626 |
| 4,419,809 | 12/1983 | Riseman et al. | 29/571 |
| 4,419,810 | 12/1983 | Riseman | 29/571 |
| 4,430,791 | 2/1984 | Dockerty | 29/571 |
| 4,493,745 | 1/1985 | Chen et al. | 156/626 |
| 4,648,937 | 3/1987 | Ogura et al. | 156/643 |

FOREIGN PATENT DOCUMENTS 26438  2/1982  Japan ................... 156/626

OTHER PUBLICATIONS

Desilets, *IBM Technical Disclosure Bulletin*, vol. 21, No. 3, Aug. 1978, pp. 1035–1037.
Hirobe et al., *J. Electrochem. Soc: Solid-State Science and Technology*, vol. 127, No. 1, Jan. 1980, pp. 234–235.
Egitto, F. D., et al., "Plasma Etching of Organic Materials. I. Polyimide in $O_2$-$CF_4$", J. Vac. Sci. Technol., vol. B3, Second Series, (May/Jun. 1985), pp. 893–904.
Schlitz, A., et al., "End Point Detection of Plasma Etched Resist Materials Using Optical Emission of Natural or Additive Tracers", J. Electrochem. Soc., Extended Abstracts, vol. 87-2, Abs. No. 486 (Oct. 1987), pp. 685–686.
Tweed, B., et al., "Magnetron Ion Etching of Polyimide and AZ Resist for VLSI", J. Electrochem. Soc., Extended Abstracts, vol. 86-1, Abs. No. 223 (May 1986), p. 321.
Daetwyler, K., et al., "Method to Improve Resist Pattern Definition", IBM Tech. Discl. Bull., vol. 23, No. 6, (Nov. 1980), p. 2540.

Primary Examiner—F. L. Evans
Attorney, Agent, or Firm—William D. Sabo

[57] ABSTRACT

A follow-up system for monitoring the etching process in RIE equipment. A spectrometer is used in an interferometric mode for accurate thickness measuring to produce high-resolution and reproducible patterns in a layer of etchable material formed on a substrate.

4 Claims, 4 Drawing Sheets

FOLLOW-UP SYSTEM FOR ETCH PROCESS MONITORING

This application is a division of application Ser. No. 07/509,920, filed on Apr. 16, 1990, now U.S. Pat. No. 5,139,904.

BACKGROUND OF THE INVENTION

1. Field of the Invention

The present invention relates to the manufacture of advanced semiconductor products, and more particularly, to a method for producing submicronic patterns through the use of standard photoresist compositions combined with various conventional UV photolithography equipment.

2. Description of the Prior Art

With the continuous trend towards miniaturized semiconductor devices, e.g. short channel polysilicon gate (0.6 μm) FETs, a major problem to data has been to define and control polysilicon line widths smaller than conventional UV photolithography equipment can achieve on standard photoresist layers. With such classic image exposure techniques, the barrier appears to be about 0.8 μm, so that patterns with smaller dimensions cannot be created by transfer from the imaged photoresist layer.

Enhanced exposure tools for direct image printing, such as excimer lasers and X-ray machines, are not actually commercially available today, although they are of high potential interest owing to their short operating wavelengths. As far as X-ray machines are concerned, there still remain unsolved problems, such as the difficult fabrication of X-ray masks or membranes, and the production of X-rays (the major source of X-rays is a synchrotron). On the other hand, the use of excimer lasers appears to be limited to pilot or laboratory lines; their extension to manufacturing lines has not been contemplated thus far.

To overcome these drawbacks, two major techniques have been developed within the past few years, which aim to improve the semiconductor process per se. They are the so-called "sidewall image transfer" (SIT) and the "multilayer resist" (MLR) techniques. Both techniques capitalize on dry etching technologies to produce fine-line geometries with conventional UV photolithography equipment. Dry etching technologies are rapidly displacing wet etching in the fabrication of VLSICs, because of their capabilities to provide fine-line definition, highly directional etching (anisotropy) and good selectivity, so that precise device fabrication is thereby possible. Basically, dry etching includes plasma etching, a high-pressure process, and reactive ion etching or RIE, which conversely, is a low-pressure process. Under normal conditions, the latter is only anisotropic, producing vertical profiles in the etched layer; however, as will be demonstrated hereinafter, it has been found that RIE may become isotropic, provided that it is operated at high pressure.

In the manufacture of FETs, the SIT technique, basically consists of a sequence of deposition and etching steps that provide submicron FET devices with tight channel control. With this technique, the line width is determined by only the thickness of a conformal layer that can be very thin and accurate. More details of this technique can be found in U.S. Pat. Nos.: 4,430,791; 4,419,809; 4,419,810; and 4,648,937, assigned to the same assignee as the present invention. Implementing the SIT technique in semiconductor processing may require as many as 21 major steps and 4 specific masks.

The MLR technique is essentially based on the use of at least two resist layers with an intermediate layer of an etch-resistant barrier material, such as a PECVD oxide, therebetween. Implementation of the MLR technique in semiconductor processing requires 8 major steps. The MLR technique is described, in particular, in U.S. Pat. Nos. 3,873,361 and 4,003,044, both assigned to the same assignee as the present invention.

The known MLR technique, when applied to the definition of polysilicon fine-line geometries, such as required in the fabrication of polysilicon gates, is described hereinafter, in conjunction with FIGS. 1A to 1F.

Turning now to FIG. 1A, there is shown a semiconductor structure comprising an insulating substrate 10 having a layer 11 of polysilicon (500 nm thick) formed thereon, and a top multilayer photolithographic mask consisting of: a bottom thick (1200 nm) photoresist film 12, an intermediate 200 nm thick (200 nm) PECVD oxide layer 13, and a top thin (600 nm) photoresist film 14. In CMOS FET technology, the insulating substrate can be the thin gate silicon dioxide ($SiO_2$) layer that is formed above the semiconductor (e.g. silicon) body between the source and drain diffusion regions. The polysilicon layer 11 is formed by conventional deposition techniques and is to be patterned in fine-line geometries or patterns to define the gate electrodes of CMOS FETs, with determined and precise line widths, e.g. of 0.6 μm, for obtaining high-performance FETs.

The process of forming this multilayer photolithographic mask is as follows. First, the polysilicon layer 11 is treated with a photoresist adhesion promoter, such as hexamethyldisilazane (HMDS). The bottom resist film is applied by spin coating and dried. Any standard resist is appropriate for this purpose. Then, the thin layer of PECVD oxide is deposited. Low-temperature deposition equipment, such as an Applied Materials type 5000, is adequate. This step is followed by coating the top resist film and then baking. Next, after hardening, the top resist film is exposed to UV radiation through a mask having the desired configuration in conventional UV photolithography equipment. The exposed top resist is developed in a standard KOH solution to leave the desired remaining portion or pattern that is referenced 14a in FIG. 1B. The width LWe' of pattern 14a is preferably the minimum allowed by the equipment, when operating at the limits of its resolution specifications, e.g. LWe'=0.8 μm.

This pattern is subsequently used as an in-situ mask to RIE etch the underlying PECVD oxide layer 13 to define the PECVD pattern 13a. Preferred operating conditions are 75 cc $CHF_3$ and 5 cc $O_2$, at a pressure of 50 mT (6.6 Pa) and an RF frequency power of 1350 W. The PECVD pattern 13a is then used as an in-situ mask to define a corresponding pattern 12a in the bottom thick photoresist layer 12 with vertical walls. This step is achieved in an RIE tool to produce the desired anisotropy with the following typical operating conditions: 50 cc $O_2$, 3 cc $CF_4$, a pressure of 35 mTorrs (4.7 Pa) and an RF frequency power of 1000 W. The addition of a small percentage of $CF_4$ allows improvement of both the etch rate and cleanliness. The resulting structure is shown in FIG. 1B.

In the following step, pattern 12a is eroded anisotropically in an RIE tool using the same operating conditions to ensure the desired isotropic etching, i.e. 3 cc CF₄ and 50 cc O₂, at a pressure of 35 mTorrs and 1000 W. During the overetching step, the lateral dimensions of the pattern are reduced to produce an etch bias of a determined amount dW'. It is important to note that this isotropic etching step is a TIME-controlled process. During this step, the remaining top resist pattern 14a is eliminated. At the end of the overetching step, the lateral dimension of the pattern has diminished by the quantity dWf' on both sides, so that the final pattern width is LWf' as illustrated in FIG. 1C.

Next, the remaining portion of the PECVD layer 13a is removed using the same operating conditions as given above. The resulting structure is shown in FIG. 1D, where the resist pattern 12a' that has been obtained from pattern 12a after lateral reduction is represented. Finally, pattern 12a' is used to anisotropically (unidirectionally etch) define the desired pattern 11a in the polysilicon layer 11 as shown in FIG. 1E. This last step is performed in different equipment using chlorinated gases, as is standard in the art. Once the resist pattern 12a' has been stripped off, the final resulting structure is shown in FIG. 1F. Pattern 11a that is produced by the above MLR process, has a lateral dimension or width LWf', e.g. 0.6 μm, which is less than the original dimension LWe' of 0.8 μm.

In FIG. 1F, pattern 11a is the schematic cross section of a fine-line geometry, e.g. the gate electrode of an FET. However, it must be understood, that pattern 11a is part of a whole image including all the line shaped gate electrodes formed at the same time on the wafer substrate. The above fabrication steps are summarized in TABLE I below, which makes apparent the existence of six critical steps: 2, 6, 7, 8, 9 and 10.

TABLE I

1. Pre-treatment and bottom resist coating
2. PECVD OXIDE DEPOSITION
3. Top resist coating
4. Mask alignment and exposure
5. Development
6. PECVD OXIDE RIE ETCHING
7. ANISOTROPIC RESIST RIE ETCHING
8. ANISOTROPIC RESIST RIE OVERETCHING (TIME control)
9. PECVD OXIDE REMOVAL
10. ANISOTROPIC POLYSILICON RIE ETCHING
11. Resist stripping Although the above-described MLR-based process satisfactorily solves the problem stated in the introductory part of the present application, it still has numerous inconveniences. It is a relatively complex process, involving many processing steps, six of which are critical. In addition, it necessitates the use of a PECVD oxide layer to allow the control of dimensions of the bottom resist pattern during its etching and, thus, of a specific deposition tool. As a result, it implies the use of different tools. Seen as a whole, it is an expensive process and the manufacturing yields are highly sensitive to contamination. Finally, it is a TIME-controlled process (see step 8, TABLE I), to perform the overetch. The optimum time is determined empirically, and depends, as known in the art, on many process parameters, such as: temperatures, gas pressures, flow rates, etch rates, and RF power. It is therefore clear, that even carefully exercised, the overetch step cannot be carefully controlled, which in turn, results in a process that does not have the required precision and reproducibility. For instance, the final width LWf' of 0.6 μm is given with a precision of +/−0.25 μm (3 σ), with a relatively low reproducibility.

SUMMARY OF THE INVENTION

It is, therefore, a primary object of the present invention to provide a method of producing high-resolution and reproducible patterns with standard photoresist compositions and conventional UV photolithography equipment, beyond the definition that is normally available with this equipment.

It is another object of the present invention to provide a method of producing high-resolution and reproducible patterns based on a single layer resist (SLR) process that includes a very low number of critical steps.

It is still another object of the present invention to provide a method of producing high-resolution and precise patterns avoiding the deposition of an etch-resistant barrier, e.g. a PECVD oxide layer.

It is a further object of the present invention to provide a method of producing high-resolution and reproducible patterns based on a single layer resist process wherein the definition of lateral dimensions of fine-line geometrics or patterns is not achieved by time-control techniques, but by accurate thickness-control techniques.

It is a still further object of the present invention to provide a method of producing high-resolution and reproducible patterns based on the use of a spectrometer operating in an interferometric mode for accurate thickness measuring.

It is yet still another object of the present invention to provide a method of producing high-resolution and reproducible patterns based on a single layer resist process wherein all the isotropic/anisotropic etching steps are completed in-situ in a single RIE equipment.

These and other objects are achieved according to the present invention by a method of producing high-resolution and reproducible patterns in a layer of etchable material formed on a substrate and an innovative monitoring follow-up system for accurate thickness measuring. More, specifically, there is provided a method comprising the steps of: forming a radiation-sensitive film or the layer; delineating the radiation-sensitive film to produce a first resist pattern of a first width (LWe); isotropically etching the first resist pattern to reduce both lateral and vertical dimensions; monitoring the vertical dimension reduction by accurately measuring the etched thickness (dTH); correlating the corresponding lateral dimension reduction (dW); and terminating the etching step when the appropriate lateral dimension reduction (dWf) has been obtained to produce a second derived resist pattern having the final desired width (LWf) controllably less than the first width (LWe).

In another aspect of the invention, there is provided a method comprising the steps of: delineating the layer to produce a first pattern of a first width (LWe); isotropically etching the first pattern to reduce both lateral and vertical dimensions; monitoring the vertical dimension reduction by accurately measuring the etched thickness (dTH); correlating the corresponding lateral dimension reduction (dW); and terminating the etching step when the appropriate lateral dimension reduction (dWf) has been obtained to produce a second derived pattern having the final desired width (LWf) controllably less than the first width (LWe).

In a further aspect of the invention, there is provided an innovative monitoring follow-up system wherein a spectrometer is used in an interferometric mode for accurate etched thickness measuring.

The foregoing and other objects, features and advantages of the invention will be apparent from the following more particular description of the preferred embodiments of the invention.

DESCRIPTION OF THE PREFERRED EMBODIMENT

Figure 1A:
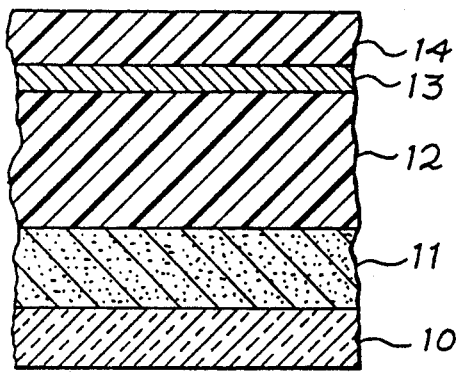
FIGS. 1A to 1F illustrate the details of the fabrication of a submicrometer polysilicon gate according to a method based on the multilayer resist (MLR) technique.
Figure 1B:
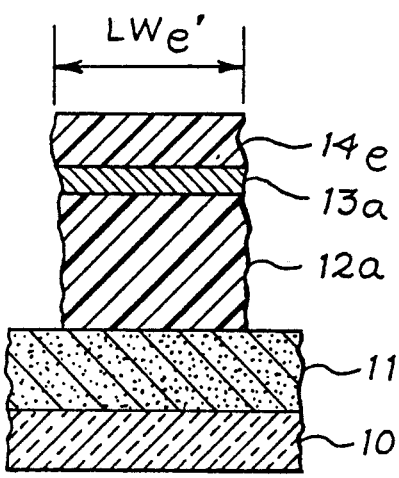
Figure 1C:
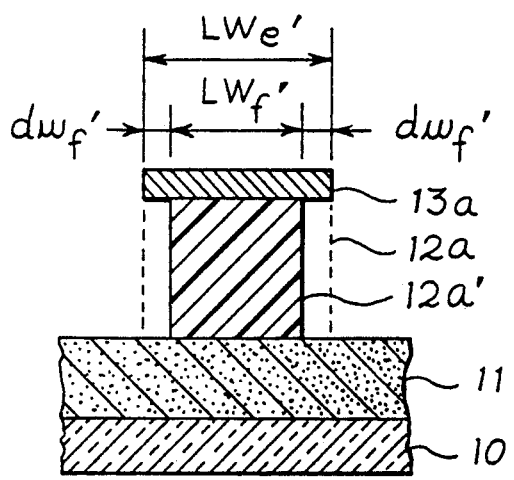
Figure 1D:
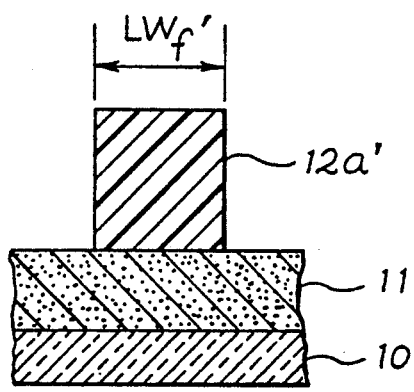
Figure 1E:
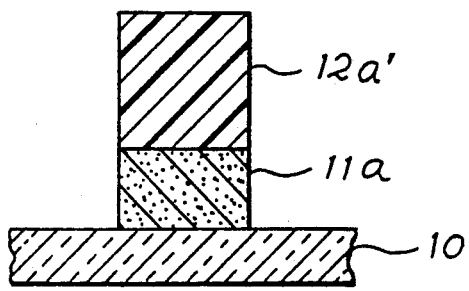
Figure 1F:
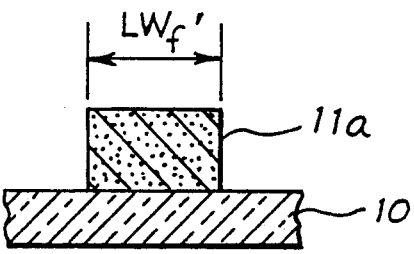
Figure 2A:
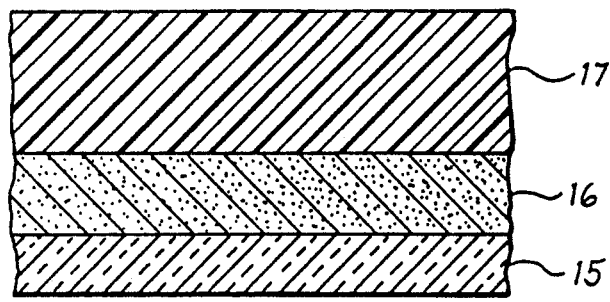
FIGS. 2A to 2D illustrate the details of the fabrication of a submicrometer polysilicon gate according to a first preferred embodiment of the method of the present invention based on a single layer resist (SLR) technique.
Figure 2B:
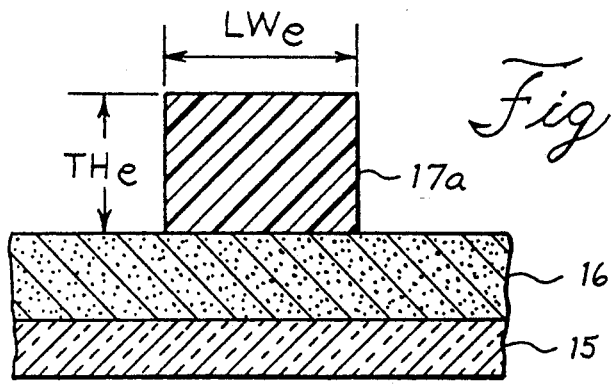

A preferred embodiment of the method of the present invention will now be described in conjunction with FIGS. 2A to 2D. In FIG. 2A, there is shown a schematic partial illustration of a semiconductor structure cross-section in an intermediate step of manufacturing. The structure has an insulating substrate 15 having a thin (500 nm) layer 16 of polysilicon and a single relatively thick (1200 nm) film 17 of a standard photoresist material formed thereon, according to conventional techniques and with the same specifications as explained above with respect to FIG. 1A. First, the structure is imaged with UV radiation through an appropriate mask in conventional UV photolithographic equipment, then subjected to a post-exposure bake at 95° C., and developed in KOH, as is standard in the art. The resulting structure is shown in FIG. 2B, where the remaining portion of the photoresist film is referenced 17a. Typical dimensions of pattern 17a after exposure and development are: thickness THe=0.8 μm and line width LWe=0.8 μm. As apparent from FIG. 2B, the pattern walls have a typical vertical slope. The structure is now introduced into a standard RIE tool, such as an AME 8100 Series Plasma Etch System available from Applied Materials, Inc. of Santa Clara, Calif., USA, and, more specifically, Model 8110. The standard operating conditions have been significantly changed, so that the structure is etched isotropically to decrease the overall dimensions of the photoresist pattern 17a. Experiments have shown that appropriate operating conditions for isotropic etch are: 97 cc $O_2$, and 3 cc $CF_4$, at a pressure of 100 mTorr (13.3 Pa) and a power of 1350 W. This unusual use of an RIE tool in a different environment (higher pressure and RF power) is considered to be a significant feature of the invention.

Figure 2C:
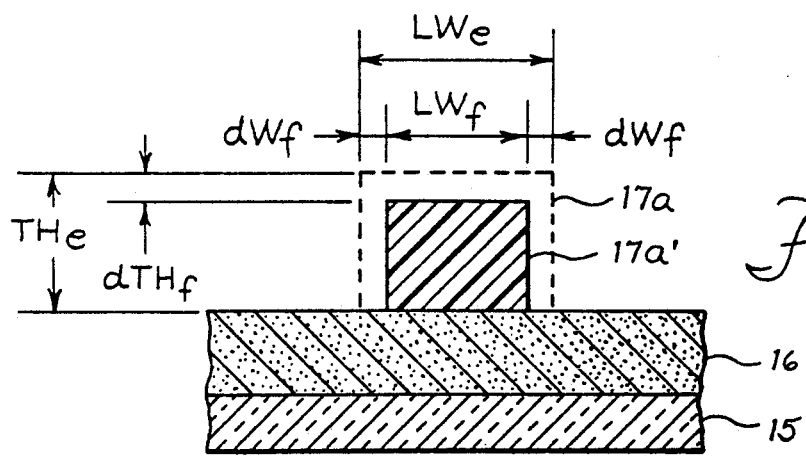
Figure 2D:
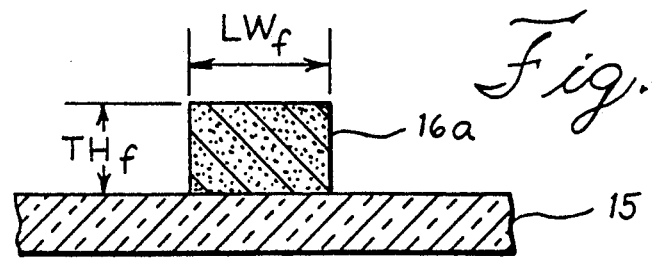

During the isotropic-etch of the pattern, thickness THe is reduced simultaneously with the lateral dimension LWe. It is a key characteristic of the present invention to accurately monitor the lateral dimension reduction dW by the continuous measuring of the pattern thickness reduction dTH. The technique of correlating the lateral dimension reduction dW with the etched thickness reduction dTH will be discussed later in more detail. Once the lateral dimension reduction has reached the desired final value dWf, corresponding to a determined value dTHf of the etched thickness, the etching step is terminated. The resulting structure is shown in FIG. 2C. The process continues in a standard manner, to anistropically etch the exposed portions of the polysilicon layer 16 in another RIE tool as explained above, to leave the line-shaped polysilicon pattern 16a having the desired final line width LWf that is illustrated in FIG. 2D. It is to be noted that with modern dry-etching tools, such as a Tegal 1511 manufactured by Tegal Corp., Petaluma, Calif., USA, all the above-mentioned RIE-etching steps can be achieved in the same equipment.

Still another embodiment is illustrated in conjunction with FIGS. 3A to 3D. This alternative can be used for the fabrication of polysilicon spacers. The initial structure is identical to the structure of FIG. 2A, except that the layer of the RIE-etchable material is shown as being thicker.

Figure 3A:
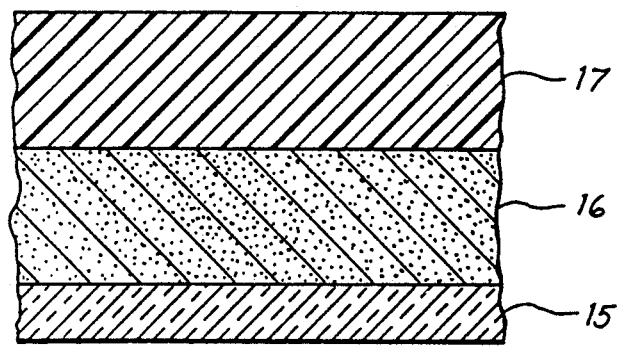
FIGS. 3A to 3D illustrate the details of the fabrication of a submicrometer polysilicon gate (or a spacer) according to a second embodiment of the method of the present invention.
Figure 3B:
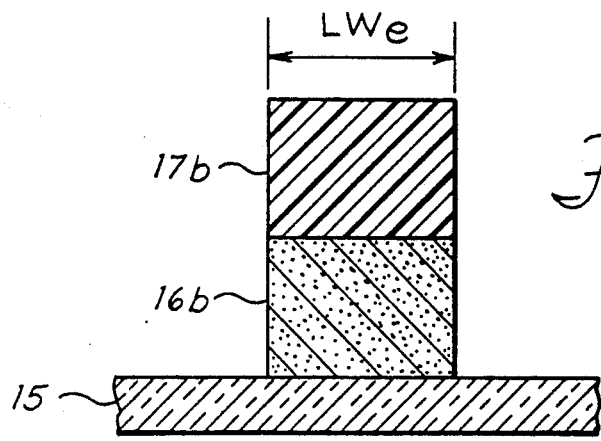
Figure 3C:
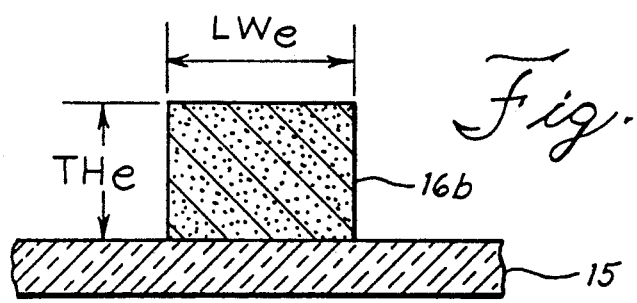
Figure 3D:
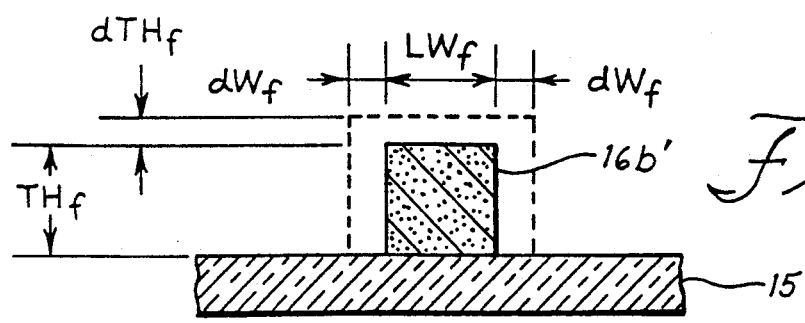

After mask alignment and exposure according to conventional photolithographic techniques, the remaining photoresist pattern referenced 17b in FIG. 2B is used as an in-situ mask to delineate the underlying polysilicon layer 16, to leave pattern 16b. After the remaining photoresist has been eliminated, the resulting structure is shown in FIG. 3C. The dimensions of the polysilicon pattern 16b are given by its thickness THe and its width LWe (its length, not represented, is immaterial). The structure is now placed in an RIE tool for isotropic etching using fluorinated gases (such as $SF_6$, $NF_3$, ...), as is known by those skilled in the art. During the isotropic etch, the pattern thickness THe is reduced simultaneously with the lateral dimension LWe. It is a key feature of the present invention to accurately monitor the lateral dimension reduction dW by continuous measurement of the pattern thickness reduction dTH. The final structure having the desired final pattern width LWf is shown in FIG. 3D.

TABLES II A and II B below briefly summarize the major steps of the method of the present invention according to both embodiments, and make apparent that it includes only two critical steps (TABLE IIA, 4, 5; TABLE IIB, 4, 6).

TABLE II A

1. Pre-treatment and resist coating
2. Mask alignment and exposure
3. Development
4. ISOTROPIC RESIST RIE ETCHING (THICKNESS control)
5. ANISOTROPIC POLYSILICON RIE ETCHING
6. Resist stripping

TABLE II B

1. Pre-treatment and resist coating
2. Mask alignment and exposure
3. Development
4. ANISOTROPIC POLYSILICON RIE ETCHING
5. Resist stripping
6. ISOTROPIC POLYSILICON PIE ETCHING (THICKNESS control)

Therefore, irrespective of its various embodiments, the method of the present invention is based on a single layer resist (SLR) process including an isotropic etching step wherein the desired lateral dimension reduction must be carefully monitored from an accurate measuring of the etched thickness.

As it appears from the above description, it is of paramount importance to accurately monitor the lateral dimension reduction dW by the continuous measuring of the pattern thickness reduction dTH. Several techniques to control the etched thickness dTH in a dry etching environment by measuring some property of the environment that changes with the thickness could be theoretically envisaged. Ellipsometry, as described in U.S. Pat. No. 4,198,261, utilizes a light source of narrow bandwidth to reflect a light beam from the sample to a light detector. Rotatable polarizing filters are positioned in both the source and the reflected light paths. Intensity of emission is monitored to determine the time where it decreases sharply. Optical emission spectroscopy (OES) uses the intensity of the given line having a characteristic wavelength, generated by the plasma, as the control parameter. More details on OES can be found in U.S. Pat. No. 4,415,402, in an application to RIE etching. It is important to note that the spectrometer aperture faces the glow discharge while the wafer is placed horizontally. No interference fringes can be produced under these conditions. The spectrometer detects only a change in intensity. Spectrometry and ellipsometry are useful and extensively used for end-point etch detection.

Figure 4:
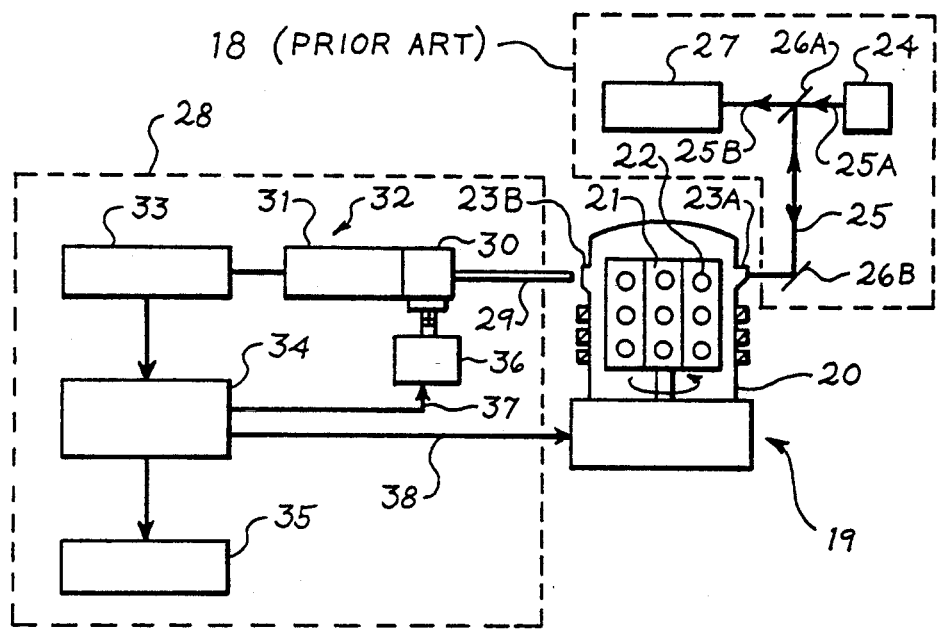
FIG. 4 shows standard RIE equipment provided with a conventional interferometer and with the innovative spectrometer-based follow-up system of the present invention for carrying out the method.

Unlike spectrometric and ellipsometric techniques, optical interferometry uses the variation in the intensity of light beams reflected from the etched portion. It is an accurate technique, that can be used for continuous monitoring of the etched thickness. Interferometry is the technique that is delivered with the above-mentioned AME RIE tool. The tool is normally provided with an interferometric system that is schematically shown in FIG. 4, where it bears reference numeral 18, while the etching system is referenced 19. The etching system 19 essentially consists of an etch treatment chamber 20 enclosing a hexode-shaped susceptor 21 that holds a plurality of wafers 22 to be processed. The treatment chamber is provided with two quartz view ports or windows 23A and 23B. One is used by the interferometric system, the other is for visual observation.

The interferometric system is referenced 18 in FIG. 4. A laser, such as Helium-Neon laser 24, produces a monochromatic radiation beam 25A that illuminates the wafers at normal incidence through view port 23A. The reflected beam 25B is applied to an interferometer 27 that essentially consists of a photodiode. A beam-splitter 26A and a mirror 26B are used in that respect to appropriately convey incident and reflected beams. The fundamentals of the measuring technique will now be briefly described hereinafter.

In a preferred operating mode, the optical window views an area of the wafer comparable in size to a portion of a chip. It is, therefore, guaranteed that both photoresist film and its underlying layer of polysilicon (see FIGS. 2A to 2D) are observed. A phase difference exists between rays which is a function of the thickness of the photoresist film and the respective indices of refraction of the film and the layer. Therefore, interferences will occur, producing either grater or lesser intensity of the total reflected energy depending on the magnitude of the phase difference. Since the thickness of the layer is decreasing as the etch process continues, the intensity of the energy reflected therefrom will undergo a periodic variation, which is commonly described as the movement of interference fringes. In the case of normal incidence, successive minima are separated by a distance which corresponds to the etched thickness during one period T.

Figure 5:
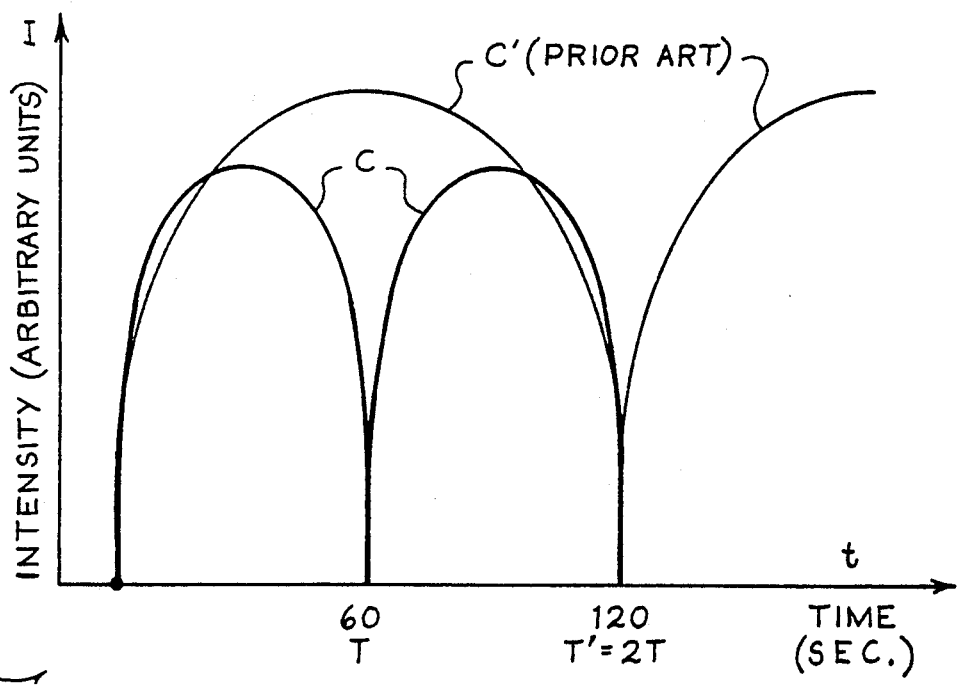
FIG. 5 is a representation of typical graphical output signals produced by the conventional interferometer and by the follow-up system of the present invention.

Curve C in FIG. 5 shows the intensity of the output signal produced by photodiode 27 versus time that is obtained with such a HeNe laser, the wavelength of which is $\lambda = 632.8$ nm. Each period $T' = 120$ sec corresponds to an etched thickness of dTH = 0.17 $\mu$m. As is known, to increase precision, half a period (maximum of the curve) can be used, by deriving the output signal. The system referenced 18 in FIG. 4 is not accurate enough to be satisfactorily implemented with the method of the present invention. Of course, other lasers having shorter wavelengths could be used as well, but they need more space, so that they are not really convenient in a manufacturing environment. In addition, a HeNe laser needs an accurate positioning on a localized and determined area of the chip, as explained above. The HeNe laser interferometer used for etch end-point allows the control of the thickness erosion for each period during plasma etch, but this laser has a fixed and high wavelength, which is not appropriate for accurate measuring. In fact, to have good control of the etched thickness, it is necessary to cover at least one complete period.

No adequate system being available, there has been developed according to the invention an innovative and accurate follow-up monitoring system using a standard spectrometer operating in an interferometric mode.

According to the present invention, there is disclosed the original use of a spectrometer as an interferometer to control the partial removal of the resist until the desired final thickness (THf) and, therefore, the lateral dimension or width (LWf) is reached. The details of the effective follow-up system of the present invention for monitoring the overetch step of the present method, e.g. step 4 in TABLE II A of the first embodiment, is also shown in FIG. 4. In FIG. 4, the follow-up system bears reference numeral 28. Interferometry can be used, because with the present method, intermediate PECVD oxide layer (13, FIG. 1A) is not employed. The plasma inside the treatment chamber produces a glow discharge, i.e. a light source where short wavelengths are available with a large choice. Some lines, under certain circumstances, can produce interferences. The glow discharge produced by the plasma can be observed through the view port. This way, an optical spectrometer can be used as an interferometer.

Fiber probe 29 is connected to view port 23B for transmitting the radiations emitted by the different species that are produced in the chamber during the etching process. In actuality, the follow-up system 28 of the present invention replaces the standard system 18, and uses view port 23A, still leaving the other view port for visual observation. The transmitted radiation is received by a motor-driven monochromator 30 which filters out all wavelengths except the one selected to be monitored. The characteristic selected radiation is then received by detector 31. Detector 31 may be either a low-noise diode detector, or preferably, a low-noise photomultiplier tube combined with an amplifier. Monochromator 30 and detector 31 are integral and form the spectrometer 32, e.g. a model SD20 available from the Sofie Inst., Arpajon, France. It is tunable over a wide-range spectrum and, in the present case, is tuned to span the CO line of 309.8 nm. The analog signal supplied by the spectrometer 32 is applied to an A/D converter 33 and then inputted to a computer 34. The signal produced by spectrometer 32 is representative of the intensity of emission of the monitored species. A chart recorder unit 35 is connected to the computer. Also, the latter controls both the motor 36 and the etch system 19, respectively, through control lines 37 and 38. Computer 34 receives the digital signal that is processed and outputs the intensity of an emission graph that is reproduced by the chart recorder 35.

Experimental results conducted in the course of the first embodiment demonstrate that the species to be monitored during the etching of the photoresist pattern 17a atop the polysilicon layer 16 in FIG. 2C is carbon monoxide CO. It is very important to have the optical fiber connected perpendicularly to the wafer for normal incidence to obtain an interferometric-like laser effect with maxima and minima (at zero crossing) of the output signal. When parallel, as taught in the prior art, see for instance U.S. Pat. No. 4,415,402 cited above, only a continuous curve illustrating intensity versus time can be recorded. Experiments have shown that the etched thickness dTH for one period is given below in TABLE III.

TABLE III

| | |
|---|---|
| λ = 519.8 nm (CO line) | dTH = 0.15 μm |
| λ = 313.5 nm (CO line) | dTH = 0.10 μm |
| λ = 309.8 nm (CO line) | dTH = 0.08 μm |

The shorter the light beam wavelength, the smaller the thickness per period, and thus, the thickness increment and precision that can be monitored. High-precision etch control allows good linewidth reduction control. With an adequate line (or wavelength), it is possible to get a linewigth LWf control with very small steps for each period.

FIG. 5 shows curve C, that is representative of the intensity vs. time using the shortest CO radiation ($\lambda = 309.8$ nm) for increased precision.

The final etched thickness dTHf accurately corresponds to the final desired linewidth LWf according to the computation described below. The formula that gives the etch rate ER is given by the relation:

$$ER = (\lambda/4nT), \text{ wherein}$$

λ is the value of the wavelength of the monochromatic radiation produced by the HeNe laser source ($\lambda = 632.8$ nm) or of the selected line in the glow discharge (e.g. $\lambda = 309.8$ nm from the shortest CO line);

n is the refractive index for the material to be etched, e.g. photoresist; n depends on the layer thickness and the wavelength, e.g. n=1.8 for THf=1 μm and λ=309.8 nm; and, T=time for one period.

The etch rate for the photoresist can be determined, using the observed time between successive minima or period T, and can be varified on SEM cross sections. The etch rate ER, when known, allows continuous calculation of the etched thickness dTH:

$$dTH = ER \times t$$

where t is elapsed time.

When a relation between the etched thickness for one period has been established, it is easy to control the lateral dimension reduction.

The horizontal-to-vertical etch ratio EPRhv is:

$$ERRhv = ERh/ERv, \text{ where}$$

ERv is the measured vertical-etch rate, and
ERh is the measured horizontal-etch rate.

Generally, ERRhv is close to one (ideal isotropy means ERRhv=1), but in actuality accurate monitoring is necessary, and the real value of ERRhv must be determined through preliminary experiments. Basically, ERRhv ranges from 0.5 to 0.75 depending primarily on the pattern factor, e.g. the percentage of the wafer that is covered by the photoresist film. The pattern factor is obtained in practice from the mask.

Quantity dTH×ERRvh represents the lateral dimension reduction dW per edge, so the total reduction is twice more. At completion of the process:

$$LWf = LWe - 2dW = LWe - (2 \times dTHf \times ERRhv)$$

This computation allows continuous tight linewidth control and also attaining the final desired linewidth dimension LWf.

In summary, a standard RIE tool is provided with an HeNe laser source for interferometric measures. But, because of the relatively high wavelength ($\lambda = 632.8$ nm), the measurement of the etched thickness (dTH) with system 18 is not sufficiently accurate. FIG. 5 shows curve C that illustrates a period T' of about 120 sec. which corresponds to dTH=0.17 μm. It has been recognized, according to the invention, that radiations that are naturally produced by the glow discharge during the etching process, not only have shorter wavelengths but, may, under certain conditions, also produce interferometric fringes. As a result, the follow-up monitoring system of the present invention, referenced 28 in FIG. 4, provides much higher precision than the known systems. In FIG. 5, curve C is representative of the interferences obtained with the shortest CO line ($\lambda =$ shortest CO line ($\lambda = 309.8$ nm), which allows etched thickness as low as dTH=0.08 μm with a corresponding period T of about 60 sec. (T is approximately one-half of T'.) As a result, the method of the present invention allows production of polysilicon line widths of 600 nm with a precision of $+/-180$ nm at $3\sigma$.

Advantages of the method of producing high-resolution and reproducible patterns of the present invention, that are based on SLR, rather than on MLR, include:

(i) simpler, cheaper and shorter process (6 instead of 11 steps), 2 of which are critical instead of 6;
(ii) no PECVD oxide deposition required, avoiding the use of costly PECVD tools and permitting use of interferometry;
(iii) lower sensitivity to foreign material contamination and resist pinhole;
(iv) steps 4 and 5 (Table IIA) can be completed in one single RIE equipment, such as a Tegal 1511;
(v) higher resolution and more precise patterns are obtained owing to the accurate in-situ monitoring process control based on precise interferometric measures instead of using a timer;
(vi) better etching uniformity;
(vii) reproducibility.

More generally, the method of the present invention can be applied to other materials (e.g. oxides, metals, and so forth), or other processing steps (e.g. resist etch back for self-aligned processes), other applications, etc.

In addition, an algorithm can be developed to more accurately determine the etch end-point of the entire batch of wafers.

While the invention has been particularly shown and described with reference to preferred embodiments thereof, it will be understood by those skilled in the art that various changes in form and details may be made therein without departing from the spirit and scope of the invention.

What is claimed is:

1. A follow-up system for monitoring the etching process in RIE equipment to produce high-resolution and reproducible patterns in a structure to be etched, having a treatment chamber for containing a plasma, which produces a glow discharge during the etching process, and provided with a quartz view port and a susceptor that holds a semiconductor wafer bearing said structure, said system comprising:

(a) an optical fiber means disposed close to said view port and perpendicular to said wafer;
   (b) spectrometer means for filtering one line of a determined species that is produced during the etching process by the glow discharge to select a characteristic wavelength $\lambda$, and generating a variable output signal representative of the intensity of that line having maxima and minima depending on the etched thickness of said structure; and
   (c) means for detecting said output signal so that the etched thickness is accurately measured on a continuous basis.

2. The follow up system of claim 1, wherein said structure includes a photoresist pattern formed on polysilicon.

3. The follow up system of claim 2, wherein the selected wavelength corresponds to the shortest CO line that is available in the glow discharge.

4. The follow-up system of claim 3, wherein $\lambda = 309.8$ nm.

* * * * *